(12) United States Patent
Petti

(10) Patent No.: US 7,706,177 B2
(45) Date of Patent: Apr. 27, 2010

(54) METHOD OF PROGRAMMING CROSS-POINT DIODE MEMORY ARRAY

(75) Inventor: Christopher J. Petti, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 282 days.

(21) Appl. No.: 12/003,571

(22) Filed: Dec. 28, 2007

(65) Prior Publication Data

US 2009/0168507 A1    Jul. 2, 2009

(51) Int. Cl.
*G11C 11/00*    (2006.01)

(52) U.S. Cl. ........................ 365/163; 365/175

(58) Field of Classification Search ................ 365/163, 365/175, 185.18, 185.19
See application file for complete search history.

(56) References Cited

U.S. PATENT DOCUMENTS

| | | | |
|---|---|---|---|
| 6,952,030 B2 | 10/2005 | Herner et al. | |
| 7,176,064 B2 | 2/2007 | Herner | |
| 2005/0042825 A1* | 2/2005 | Kitamura et al. | 438/257 |
| 2005/0226067 A1 | 10/2005 | Herner et al. | |
| 2006/0067117 A1 | 3/2006 | Petti | |
| 2006/0071298 A1 | 4/2006 | Hui et al. | |
| 2007/0002610 A1* | 1/2007 | Knall | 365/175 |
| 2007/0069276 A1 | 3/2007 | Scheuerlein et al. | |
| 2007/0070690 A1* | 3/2007 | Scheuerlein et al. | 365/171 |
| 2007/0072360 A1 | 3/2007 | Kumar et al. | |
| 2007/0164388 A1 | 7/2007 | Kumar et al. | |
| 2007/0284656 A1 | 12/2007 | Radigan et al. | |

FOREIGN PATENT DOCUMENTS

WO     WO 2008/016835 A1    2/2008

OTHER PUBLICATIONS

U.S. Appl. No. 11/819,562, filed Jun. 28, 2007, Albert Meeks et al.

* cited by examiner

*Primary Examiner*—Son Dinh
(74) *Attorney, Agent, or Firm*—Foley & Lardner LLP

(57) ABSTRACT

A method of programming a nonvolatile memory array including a plurality of nonvolatile memory cells, a plurality of bit lines, and a plurality of word lines, wherein each memory cell comprises a diode, or a diode and a resistivity switching element is disclosed. The method includes both bias programming the memory cells of the device.

18 Claims, 12 Drawing Sheets

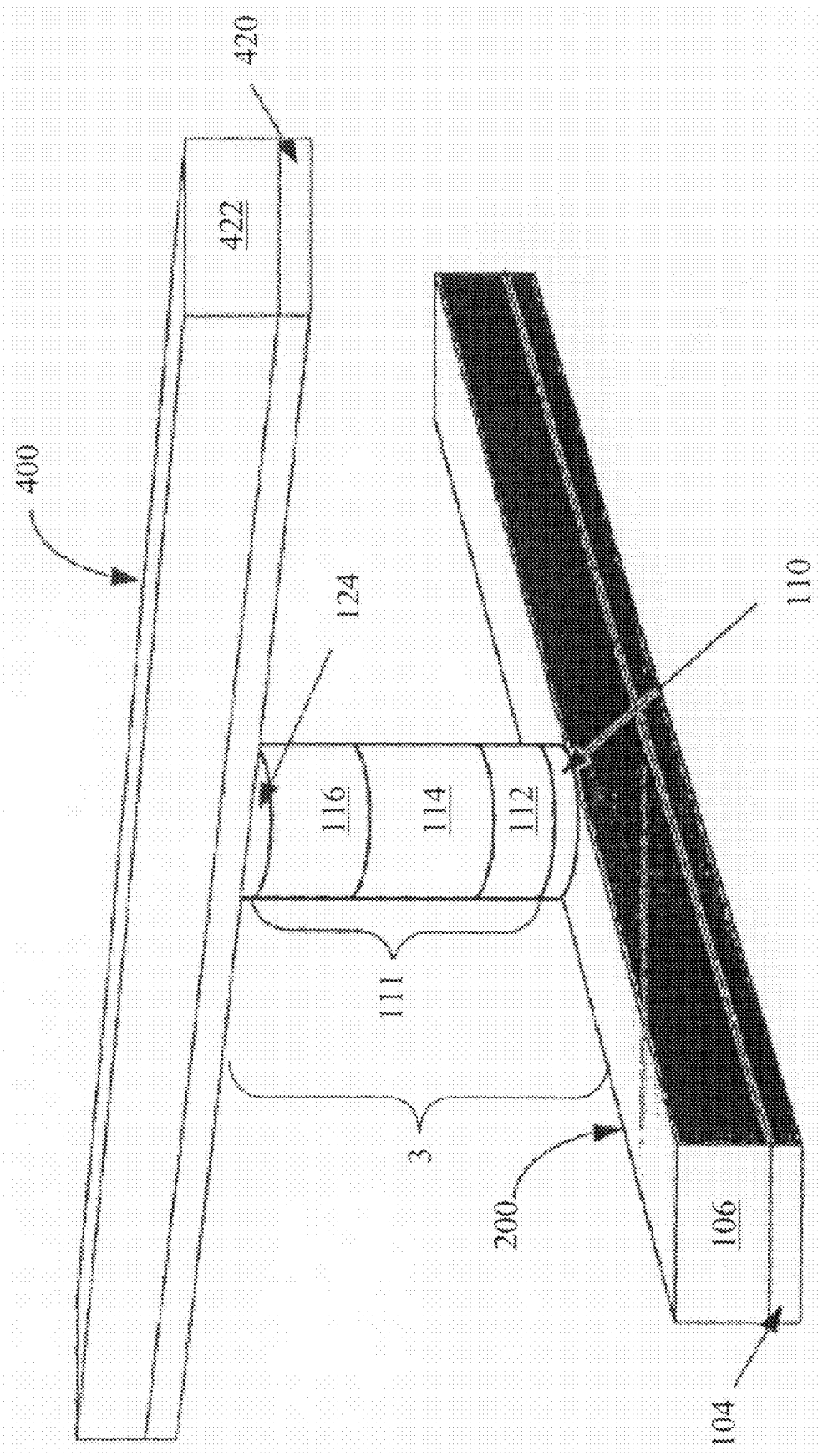

METHOD OF PROGRAMMING CROSS-POINT DIODE MEMORY ARRAY

BACKGROUND OF THE INVENTION

The invention relates to a nonvolatile memory array.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

Some solutions for achieving erasable or multi-state cells are complex. Floating gate and SONOS memory cells, for example, operate by storing charge, where the presence, absence or amount of stored charge changes a transistor threshold voltage. These memory cells are three-terminal devices which are relatively difficult to fabricate and operate at the very small dimensions required for competitiveness in modern integrated circuits.

Other memory cells operate by changing the resistivity of relatively exotic materials, like chalcogenides. Chalcogenides are difficult to work with and can present challenges in most semiconductor production facilities.

SUMMARY OF THE PREFERRED EMBODIMENTS

One embodiment of the invention provides a method of programming a nonvolatile memory array comprising a plurality of nonvolatile memory cells, a plurality of bit lines, and a plurality of word lines, wherein each memory cell comprises a diode. The method comprises: applying a first reverse bias voltage to at least one selected memory cell such that at least one diode of the at least one selected memory cell is placed in a reverse breakdown state, while at a same time applying a second voltage to adjacent non-selected memory cells which share a bit line or a word line with the at least one selected memory cell such that the diodes of the adjacent non-selected memory cells are not placed in a reverse breakdown state.

Another embodiment of the invention provides a method of programming a nonvolatile memory array comprising a plurality of nonvolatile memory cells, a plurality of bit lines and a plurality of word lines, wherein each memory cell comprises a diode and a resistivity switching element in a high resistivity state located in series with the diode. The method comprises: applying a forward bias voltage to at least one selected memory cell such that at least one resistivity switching element of the at least one selected memory cell is placed in a low resistivity state; and applying a first reverse bias voltage to the at least one selected memory cell after the step of applying the forward bias voltage such that at least one diode of the at least one selected memory cell is damaged but not destroyed.

The preferred aspects and embodiments will now be described with reference to the attached drawings.

BRIEF DESCRIPTION OF THE DRAWINGS

FIGS. 2 and 9 are perspective views of memory cells formed according to a first preferred embodiment of the present invention.

DETAILED DESCRIPTION OF THE PREFERRED EMBODIMENTS

It has been known that by applying electrical pulses, the resistance of a resistor formed of doped polycrystalline silicon, or polysilicon, can be trimmed, adjusting it between stable resistance states. Such trimmable resistors have been used as elements in integrated circuits.

Figure 1:
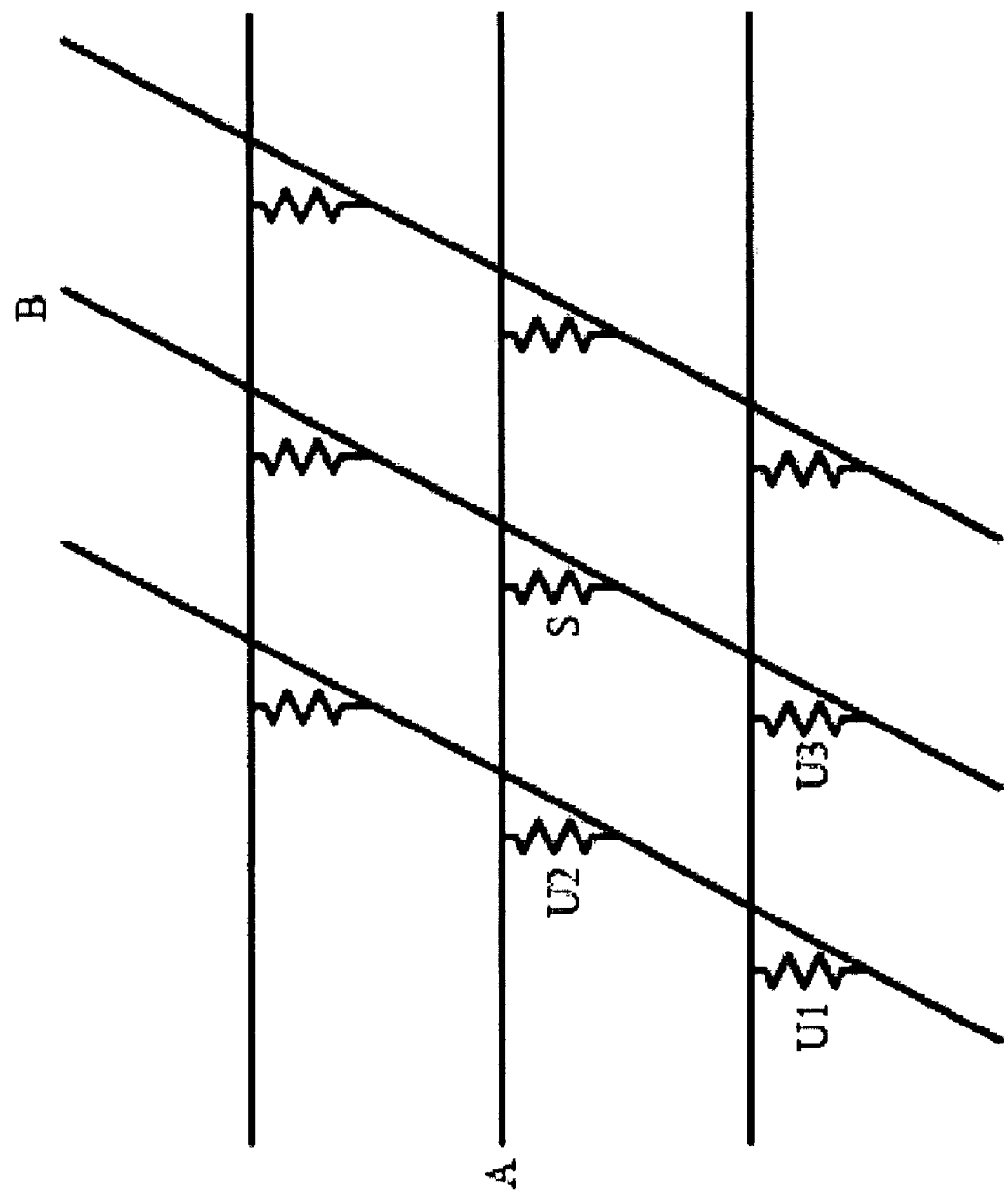
FIG. 1 is a circuit diagram illustrating the need for electrical isolation between memory cells in a memory array.

It is not conventional to use a trimmable polysilicon resistor to store a data state in a nonvolatile memory cell, however. Making a memory array of polysilicon resistors presents difficulties. If resistors are used as memory cells in a large cross-point array, when voltage is applied to a selected cell, there will be undesired leakage through half-selected and unselected cells throughout the array. For example, turning to FIG. 1, suppose a voltage is applied between bitline B and wordline A to set, reset, or sense selected cell S. Current is intended to flow through selected cell S. Some leakage current, however, may flow on alternate paths, for example between bitline B and wordline A through unselected cells U1, U2, and U3. Many such alternate paths may exist.

Leakage current can be greatly reduced by forming each memory cell as a two-terminal device including a diode. A diode has a non-linear I-V characteristic, allowing very little current flow below a turn-on voltage, and substantially higher current flow above the turn-on voltage. In general a diode also acts as one-way valves passing current more easily in one direction than the other. Thus, so long as biasing schemes are selected that assure that only the selected cell is subjected to a forward current above the turn-on voltage, leakage current along unintended paths (such as the U1-U2-U3 sneak path of FIG. 1) can be greatly reduced.

Herner et al., U.S. patent application Ser. No. 11/148,530, "Nonvolatile Memory Cell Operating by Increasing Order in Polycrystalline Semiconductor Material," filed Jun. 8, 2006; and Herner, U.S. patent application Ser. No. 10/954,510, "Memory Cell Comprising a Semiconductor Junction Diode Crystallized Adjacent to a Silicide," filed Sep. 29, 2004, both owned by the assignee of the present invention and both hereby incorporated by reference, describe that crystallization of polysilicon adjacent to an appropriate silicide affects the properties of the polysilicon. Certain metal silicides, such as cobalt silicide and titanium silicide, have a lattice structure very close to that of silicon. When amorphous or microcrystalline silicon is crystallized in contact with one of these silicides, the crystal lattice of the silicide provides a template to the silicon during crystallization. The resulting polysilicon will be highly ordered, and relatively low in defects. This high-quality polysilicon, when doped with a conductivity-enhancing dopant, is relatively highly conductive as formed.

As noted, including a diode between conductors in the memory cell allows its formation in a highly dense cross-point memory array. In preferred embodiments of the present invention, then, a polycrystalline, amorphous, or microcrystalline semiconductor memory element is formed of the diode itself, either alone, or in combination with a resistivity switching element.

Figure 2:
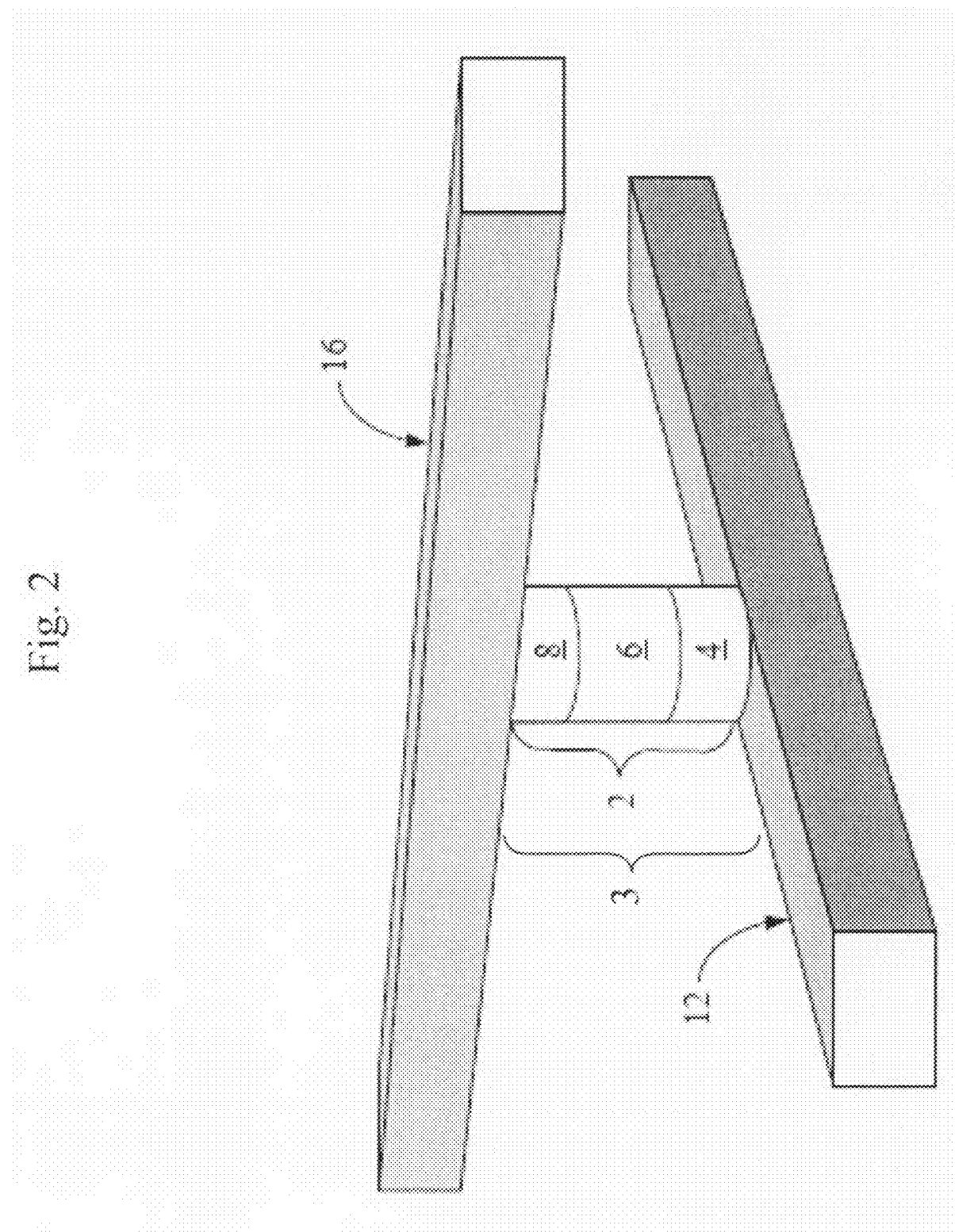

FIGS. 2 and 9 illustrate a memory cell 3 formed according to a first preferred embodiment of the present invention. Referring to FIG. 2, a bottom conductor 12 is formed of a conductive material, for example tungsten, and extends in a first direction, where the bottom conductor 12 contacts the memory cell 3. Barrier and adhesion layers may be included in bottom conductor 12. The memory cell 3 comprises a polycrystalline semiconductor diode 2, which has a bottom heavily doped n-type region 4; an intrinsic region 6, which is not intentionally doped; and a top heavily doped p-type region 8, though the orientation of this diode may be reversed. Such a diode, regardless of its orientation, will be referred to as a p-i-n diode. Top conductor 16 may be formed in the same manner and of the same materials as bottom conductor 12, and extends in a second direction different from the first direction, where the top conductor 16 contacts the memory cell 3. Polycrystalline semiconductor diode 2 is vertically disposed between bottom conductor 12 and top conductor 16. Polycrystalline semiconductor diode 2 is formed in a low-resistivity state. This memory cell 3 can be formed above a suitable substrate, for example above a monocrystalline silicon wafer.

Preferably, in this first embodiment, the nonvolatile memory cell 3 consists essentially of the diode 2. The memory cell 3 in this first embodiment does not include any active or passive device, such as a transistor, a capacitor, a resistor, a fuse, an antifuse, a charge storage material, a phase change material or a resistivity change material, except the diode 2. The memory cell 3 may also contain an insulating material which surrounds the diode, as will be described below, and other optional layers. The memory cell 3 comprises a read/write memory cell. The diode 2 acts as the read/write element of the memory cell, by being programmed to switch from a first resistivity state to a second resistivity state different from the first resistivity state in response to an applied bias (i.e., pulse) as will be explained in more detail below.

As shown in FIG. 2, the diode 2 comprises a polycrystalline semiconductor diode, such as a polycrystalline silicon, germanium or silicon-germanium p-i-n pillar diode having a substantially cylindrical shape. As will be explained in more detail with respect to FIG. 9, at the memory cell 3 may include a metal silicide layer 124, such as titanium silicide, titanium germanide or titanium silicide-germanide layer, having the C49 phase, in physical contact with the diode 2. As shown in FIG. 9, the silicide layer 124 preferably does not extend the entire length of the adjacent electrode 16, 400, but is physically located only on the substantially cylindrical pillar shaped diode 2, 111. The silicide layer acts as a crystallization template for the semiconductor diode 2 such that the diode is fabricated in the low resistivity, programmed state without an electrical programming step. Without wishing to be bound by a particular theory, the low resistivity of the diode is believed to be a result of a large grain size of the polycrystalline semiconductor material that is crystallized in contact with the crystallization template.

Figure 3:
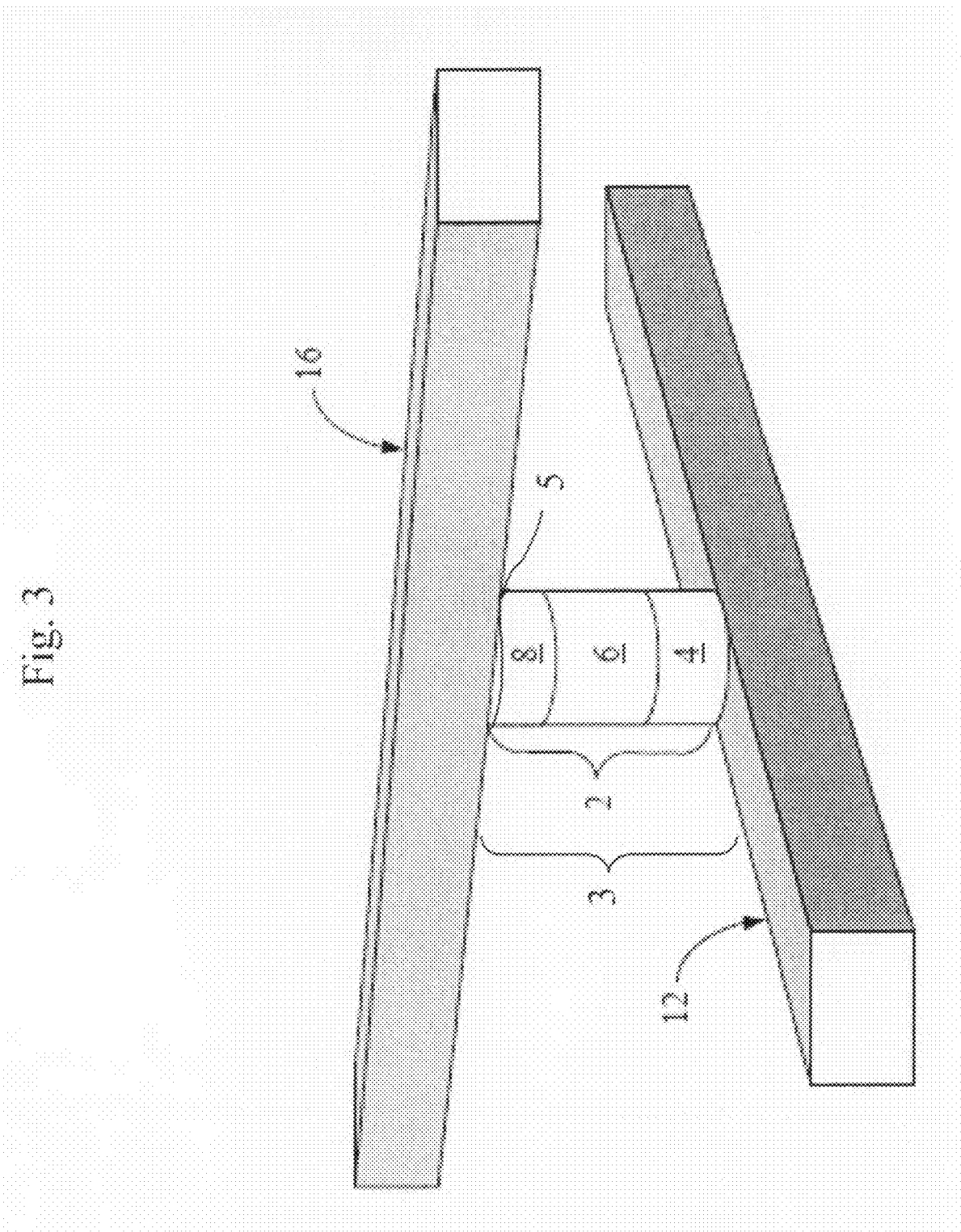
FIG. 3 is a perspective view of a memory cell formed according to a second preferred embodiment of the present invention.

FIG. 3 illustrates a memory cell 3 formed according to a second preferred embodiment of this invention. In contrast to the first embodiment, in this second embodiment, the memory cell 3 includes a resistivity switching element 5 arranged in series with the diode 2. Examples of the resistivity switching element in the cell includes antifuse, fuse, polysilicon memory effect cell, metal oxide memory, switchable complex metal oxide, carbon nanotube memory, phase change material memory, conductive bridge element, or switchable polymer memory. If the resistivity switching element 5 is an antifuse, the antifuse material may comprise silicon oxide, as is known for antifuses, or any other suitable antifuse material.

In the second embodiment, the diode 2 may be a p-i-n diode in a similar fashion to the first embodiment. In the second embodiment, however, the diode is preferably formed in a high resistivity state, and thus may be formed without a silicide layer acting as a template to form the diode in a low-resistivity state.

Preferably, in this second embodiment, the nonvolatile memory cell 3 consists essentially of the diode 2 and the resistivity switching element 5 arranged in series with the diode 2. The memory cell 3 in this second embodiment does not include any active or passive device, except the diode 2 and the resistivity switching element 5.

Figure 4:
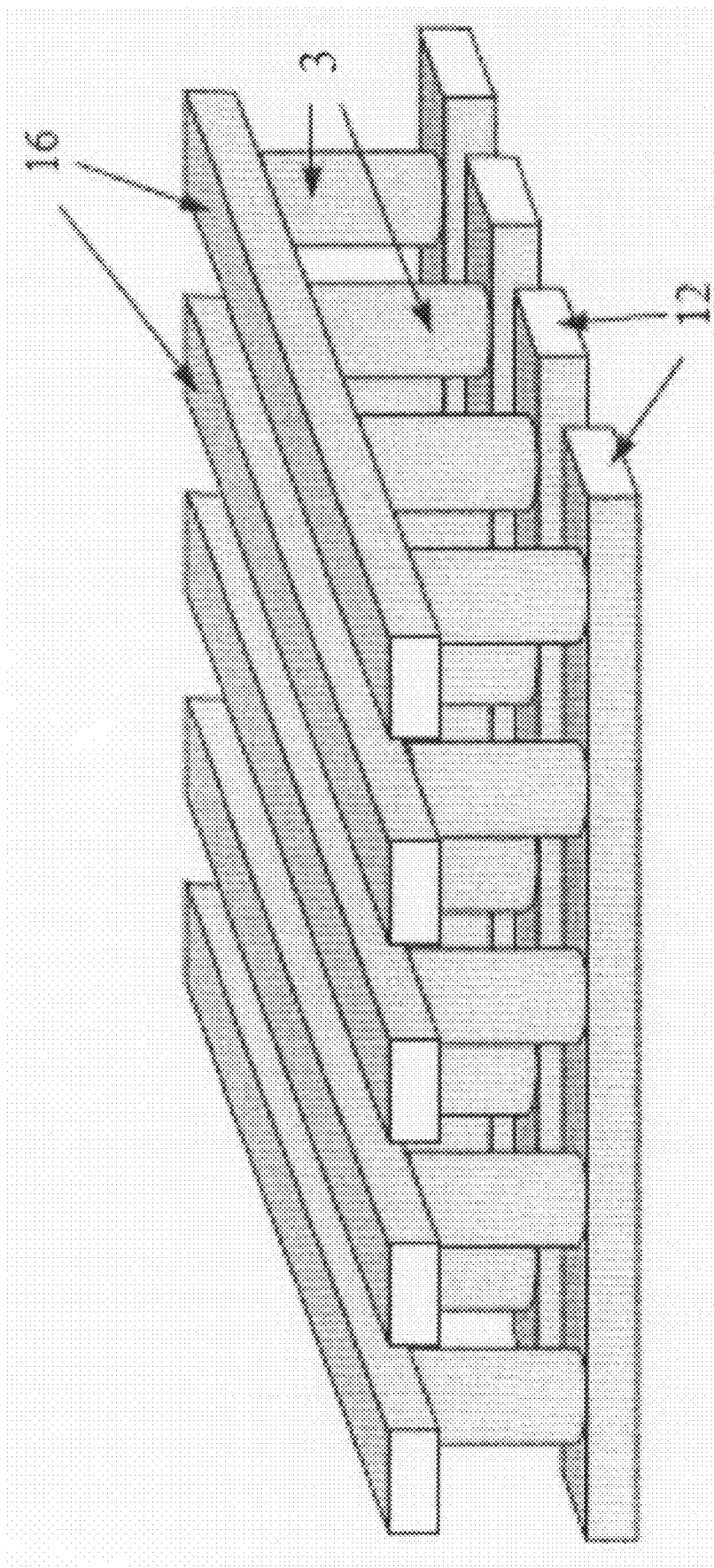
FIG. 4 is a perspective view of a portion of a memory level comprising the memory cells of the first or second embodiments.

FIG. 4 shows a portion of a memory level of such devices formed in a cross-point array, where memory cells 3 are disposed between bottom conductors 12 and top conductors 16. The memory cells 3 for the cross point array may comprise, for example, the memory cells of either the first or the second embodiment. Multiple memory levels can be stacked over a substrate to form a highly dense monolithic three dimensional memory array.

Distinct data states of the memory cell 3 of the embodiments of the present invention correspond to resistivity states of polycrystalline or microcrystalline semiconductor material making up the diode, which are distinguished by detecting current flow through the memory cell (between top conductor 16 and bottom conductor 12) when a read voltage is applied. The memory cell can be used as a one-time programmable cell, for example.

One Time Programmable Cell by Reverse Bias

Figure 5:
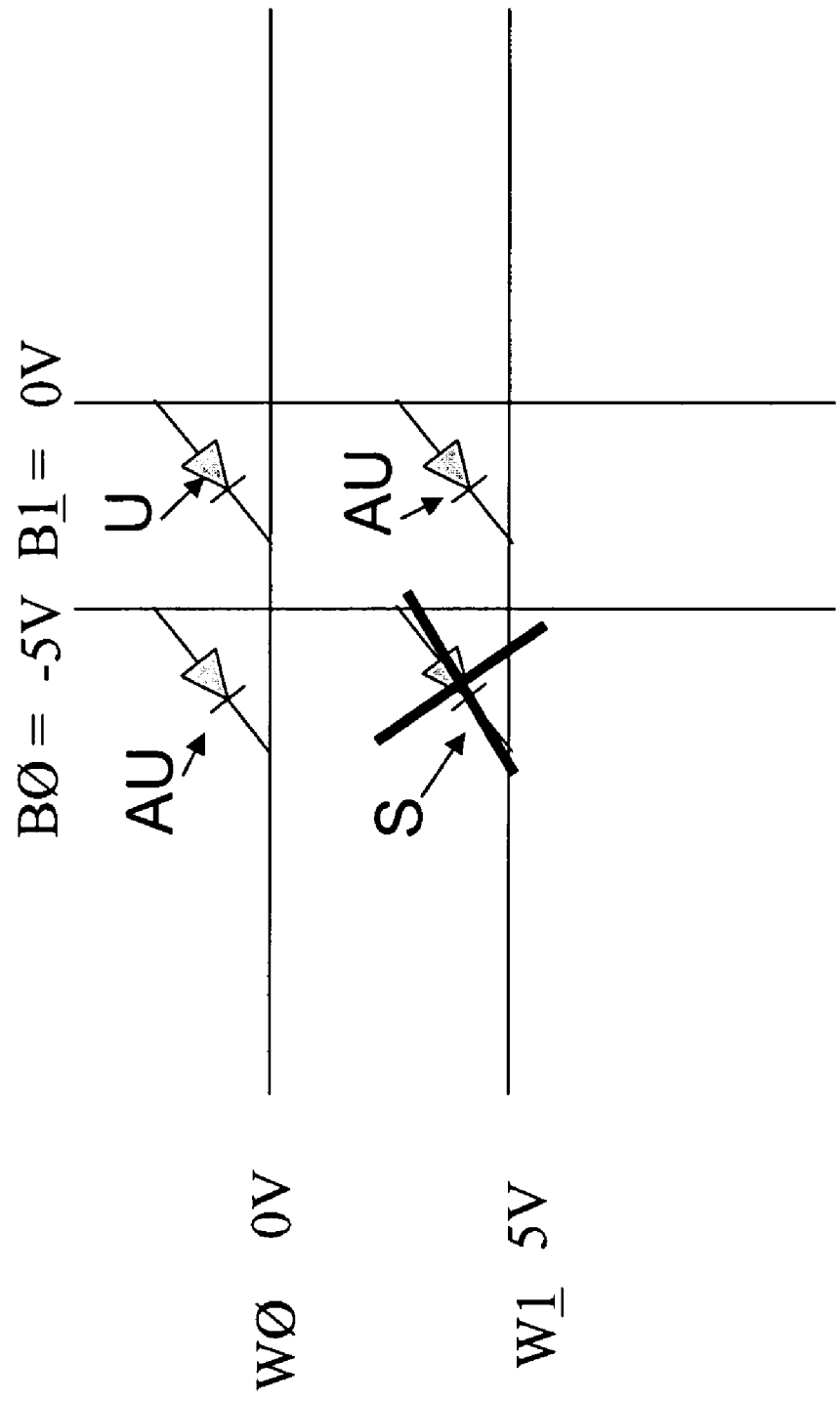
FIG. 5 is a circuit diagram showing a biasing scheme to bias a selected cell in a reverse bias for one time programming according to an embodiment of the invention.

FIG. 5 illustrates a portion of a cross-point array including word lines W0 and W1 and bit lines B0 and B1 for the purposes of explaining programming cells of a cross point array according to a preferred embodiment of the invention. Of course in general the number of word lines and bit lines of the cross-point array will be much greater than that shown in FIG. 5 for illustration purposes. The memory cell of the first embodiment (See FIGS. 2 and 9), may be programmed in an OTP fashion using a reverse bias.

In this embodiment, a voltage is applied to a selected cell S where the voltage is such that diode in the selected cell is placed in a reverse breakdown state. In the reverse breakdown state the diode is effectively destroyed, thus leaving an open circuit. When a cell with a diode in the reverse breakdown state is read, little or no read current passes through the cell.

By contrast, prior to programming the selected cell S to be in a reverse breakdown state, the cell has a relatively lower resistance, where current passes through the cell when read.

The actual voltage required to place the selected cell "S" in a reverse breakdown state will depend on many factors, including the construction of the cell, dopant levels, height of the intrinsic region, etc. A typical voltage applied may be about 10 volts. To assure that adjacent non-selected memory cells "AU" (those cells which share a bit line or a word line with the selected memory cell) are not placed in a state which substantially changes their resistivity when the selected cell is programmed, the voltage applied to the bit line and word line for the selected cell should be such that adjacent non-selected memory cells are not placed in a reverse breakdown state.

For example, FIG. 5 shows a scheme where a voltage pulse is applied such that there is a voltage of −5V applied to the bit line B0 of the selected cell S, and a voltage of 5V applied to the word line W1 of the selected cell S for a voltage of −10V applied to selected cell S. For those cells which are not selected, at least one of the word line or bit line may have an applied voltage of 0V. In this case, the pulse height of the voltage applied to the adjacent non-selected cells AU is one-half of that applied to the selected cell, or −5V, while for those cells where are not adjacent to a selected cell, i.e., the non-adjacent non-selected cells U which do not share a bit line or word line with any of the selected cells S, the applied voltage is preferably 0V. The voltage applied to the adjacent non-selected cells AU need not be exactly one-half of that applied to the selected cell S, but should be sufficiently lower than the voltage applied to the selected cell so that the state of the non-selected adjacent cells is not changed.

Of course in general, the number of memory cells in the cross point array will be much greater than the four shown in FIG. 5, and in general more than one selected memory cell may be programmed simultaneously.

Reverse Bias Programming Advantages

OTP using a reverse bias to place selected cells in a reverse breakdown state provides certain advantages. For example, destroying the cells by reverse bias may be easier because of the reduced current required as compared to forward biasing, and because the destruction under reverse biasing may be more due to a carrier ballistic effect than due to joule heating.

Moreover, programming with a reverse bias overcomes some problems which may occur with forward bias programming. Programming with a forward bias may require a large number of cells to be in a reverse bias during programming (almost all the cells in a block or $N^2$ cells), so the reverse leakage of the individual cells must be low in order to achieve low power programming.

Programmable Cell with Resistivity Switching Element

Figure 6:
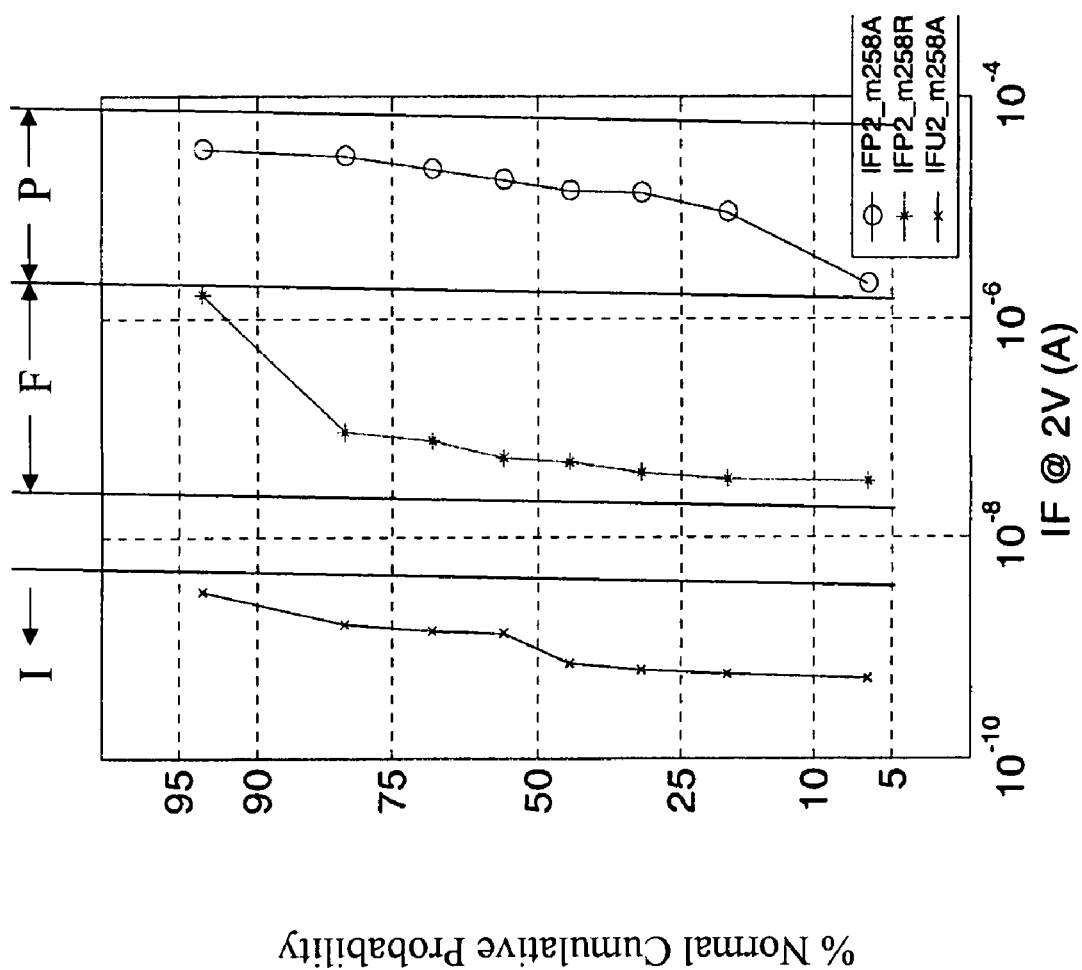
FIG. 6 is a probability plot showing memory cells transformed from the I state to the P state, and from the P state to the F state according to an embodiment of the invention.

Turning to FIG. 6, a three-state memory OTP programming scheme is described with respect to the memory cell 3 of the second embodiment shown in FIG. 3 including a memory cell having a resistivity switching element 5, such as an antifuse, in series with a diode 2 of the cell. The diode 2 is preferably fabricated in a high resistivity state, such as without contacting the silicide template, as described above. According to this programming scheme, the memory cell has an initial data state I, an second data state P, third data state F and an optional final data state J.

In the pre-programmed initial state I, the data state I can be defined, for example, as a read current between about 0.5 and 5 nanoamps, the data state P as a read current between about 2 and 50 microamps, and data state F as a read current between about 50 and 2000 nanoamps. The final data state J comprises an open circuit in which the read current is substantially zero. Those skilled in the art will appreciate that these are examples only. Actual read currents will vary with characteristics of the cell, construction of the array, read voltage selected, and many other factors. In the preprogrammed initial data state I, the resistivity switching element, such as an antifuse, is in a high resistivity state (i.e., the antifuse dielectric is intact). In order to place the cell in the lower resistivity intermediate data state P, a forward is bias is applied by applying voltages to a respective word line and/or bit line of a selected cell S so that the resistivity switching element is placed in a low resistivity state. The forward bias applied will depend upon factors such as the type of resistivity switching element. For example, if the resistivity switching element is an antifuse, an exemplary voltage of about 7 volts may be applied to provide a "soft blow" to the antifuse placing the antifuse in a low resistivity state by forming a conductive link through the antifuse dielectric. In this case, the overall resistivity of the selected cell is lowered to state P.

To program a selected cell from the second data state P to a third data state F, which places the cell in state with a resistivity between that of the initial state I and the second data state P, a reverse bias is applied by applying voltages to a respective word line and/or bit line of a selected cell S so that the diode 2 of the memory cell S is damaged and has an increased resistivity. In this case the diode is damaged but not destroyed. The particular voltage applied to damage the diode will depend on the particular diode, but an voltage of about −8.5 to about −9V is exemplary. The damage to the diode and its resistivity is irreversible in the damaged state.

A subsequent second reverse bias may be applied to the selected cell S to destroy the diode 2. This places the diode in the fourth data state J. If desired, a voltage of greater than about 10V is applied to the selected cell S to destroy its diode 2 such that this cell is substantially an open circuit having a read current that is the same as or lower than that in state I. For example the read current in state J may be substantially zero (i.e., cell S is an open circuit).

Exemplary Method of Fabricating the Memory Cell

Fabrication of a single memory level in accordance with the memory cell of the first embodiment will be described in detail. Additional memory levels can be stacked, each monolithically formed above the one below it.

Figure 7A:
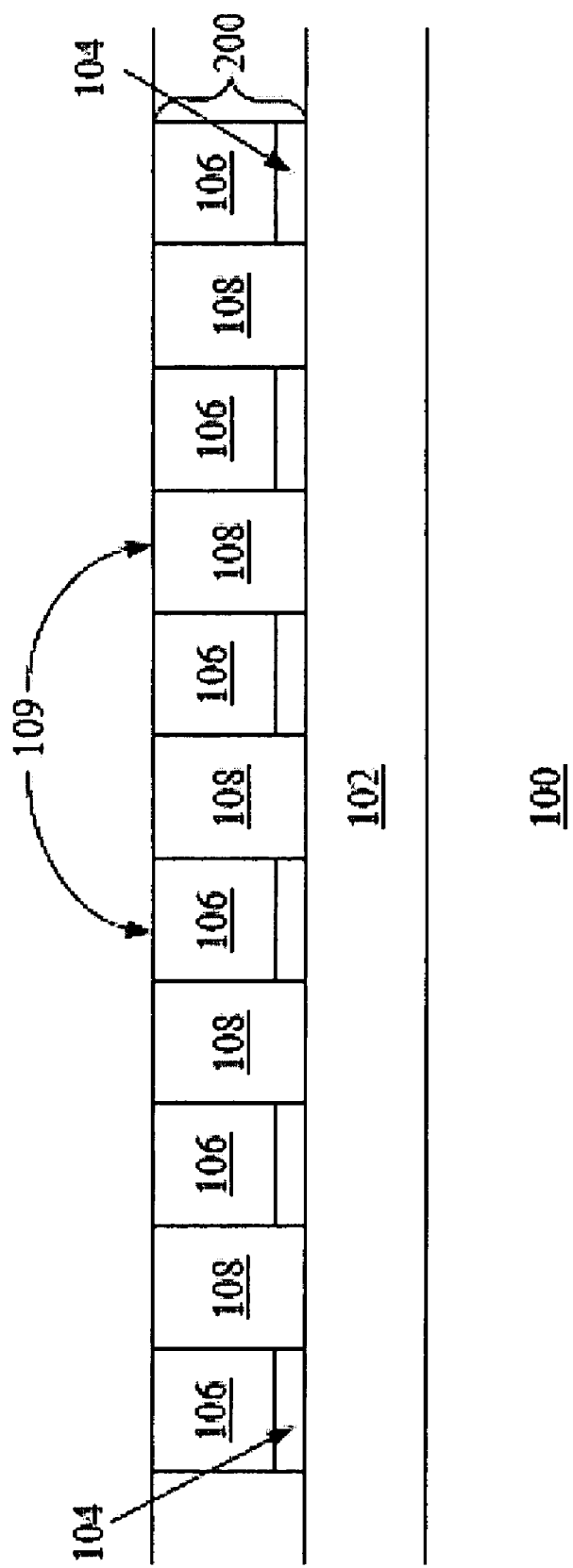
FIGS. 7a-7d are side cross-sectional views illustrating stages in formation of a memory level comprising memory cells of the first embodiment formed according to an embodiment of the present invention.

Turning to FIG. 7a, formation of the memory begins with a substrate 100. This substrate 100 can be any semiconducting substrate as known in the art, such as monocrystalline silicon, IV-IV compounds such as silicon-germanium or silicon-germanium-carbon, III-V compounds, II-VII compounds, epitaxial layers over such substrates, or any other semiconducting or non-semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 (i.e., the lower electrode 12 shown in FIG. 2) are formed over the substrate and insulator. An adhesion layer 104 may be included between the insulating layer 102 and the conducting layer 106 to help conducting layer 106 adhere to insulating layer 102. If the overlying conducting layer is tungsten, titanium nitride is preferred as adhesion layer 104.

The next layer to be deposited is conducting layer 106. Conducting layer 106 can comprise any conducting material known in the art, such as tungsten, or other materials, including tantalum, titanium, copper, cobalt, or alloys thereof.

Once all the layers that will form the conductor rails have been deposited, the layers will be patterned and etched using any suitable masking and etching process to form substantially parallel, substantially coplanar conductors 200, shown in FIG. 7a in cross-section. In one embodiment, photoresist is deposited, patterned by photolithography and the layers etched, and then the photoresist removed using standard process techniques. Conductors 200 could be formed by a Damascene method instead.

Next a dielectric material 108 is deposited over and between conductor rails 200. Dielectric material 108 can be any known electrically insulating material, such as silicon oxide, silicon nitride, or silicon oxynitride. In a preferred embodiment, silicon dioxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 7a. This removal of dielectric overfill to form planar surface 109 can be performed by any process known in the art, such as chemical mechanical planarization (CMP) or etchback. At this stage, a plurality of substantially parallel first conductors have been formed at a first height above substrate 100.

Figure 7B:
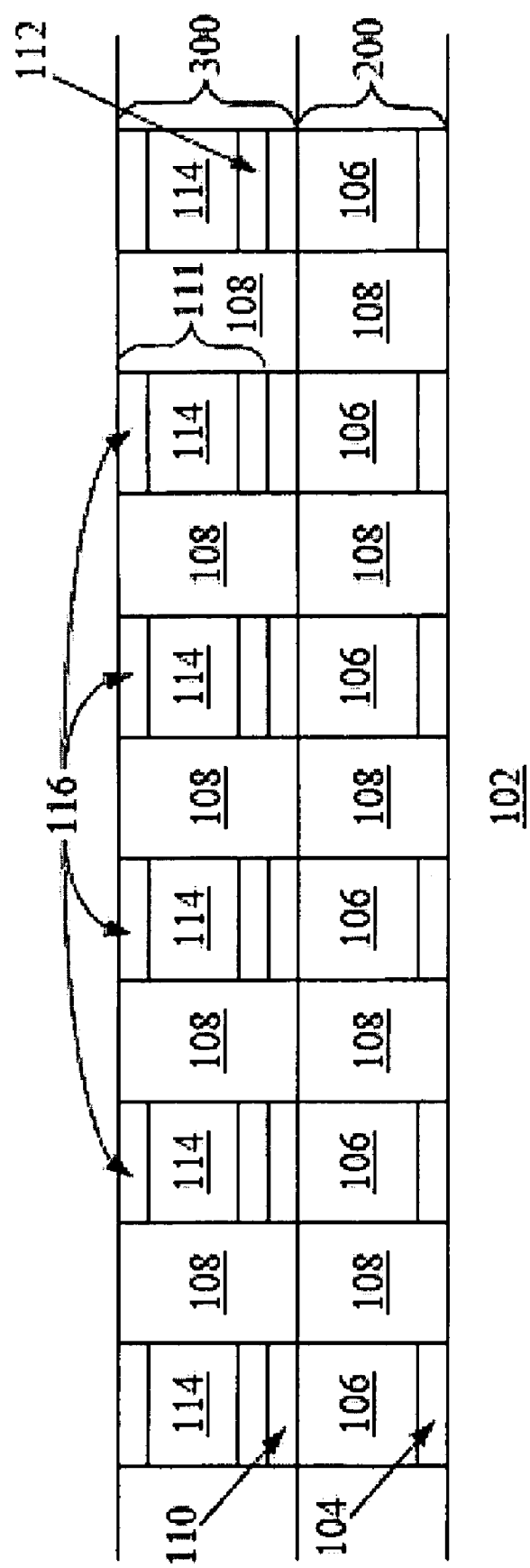

Next, turning to FIG. 7b, vertical pillars will be formed above completed conductor rails 200. (To save space substrate 100 is not shown in FIG. 7b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Next semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead. Preferably, the semiconductor material is deposited in a relatively highly resistive amorphous or polycrystalline (which includes microcrystalline) state.

In preferred embodiments, the pillar comprises a semiconductor junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

Bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 112 is preferably between about 10 and about 80 nm thick.

Intrinsic layer 114 can be formed by any method known in the art. Layer 114 can be silicon, germanium, or any alloy of silicon or germanium and has a thickness between about 110 and about 330 nm, preferably about 200 nm.

Returning to FIG. 7b, semiconductor layers 114 and 112 just deposited, along with underlying barrier layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The pitch and width of the pillars 300 can be varied as desired. In one preferred embodiment, the pitch of the pillars (the distance from the center of one pillar to the center of the next pillar) is about 300 nm, while the width of a pillar varies between about 100 and about 150 nm. In another preferred embodiment, the pitch of the pillars is about 260 nm, while the width of a pillar varies between about 90 and 130 nm. In general, the pillars preferably have a substantially cylindrical shape with a circular or roughly circular cross section having a diameter of 250 nm or less. A "substantially cylindrical" element is one with a cross section which is roughly circular; more specifically, a cross section in which no portion of the perimeter is a straight edge for a length longer than fifty percent of the longest dimension measured through the centroid of the cross-sectional area.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. The insulating layer 108 is planarized such that it surrounds the semiconductor region of the pillar 300. After CMP or etchback, ion implantation is performed, forming heavily doped p-type top region 116. The p-type dopant is preferably boron or $BF_2$. This implant step completes formation of diodes 111. Alternatively, region 116 may be deposited as a layer on layer 114 before the pillar patterning step rather than being implanted into layer 114. The resulting structure is shown in FIG. 7b and schematically in FIG. 8a.

Figure 8B:
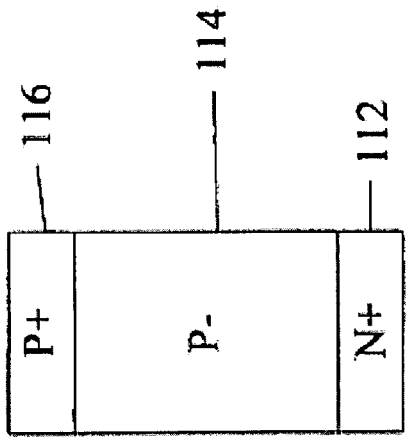
FIGS. 8a-8d are schematic side cross-sectional views illustrating alternative diode configurations according to an embodiment of the present invention.
Figure 8D:
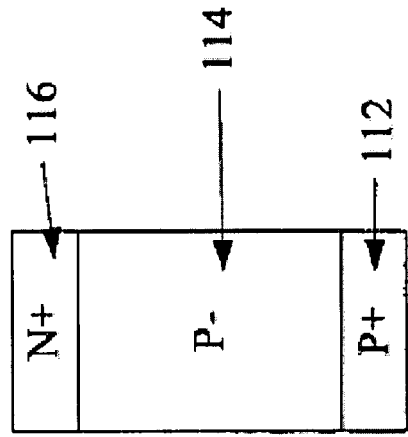
Figure 8A:
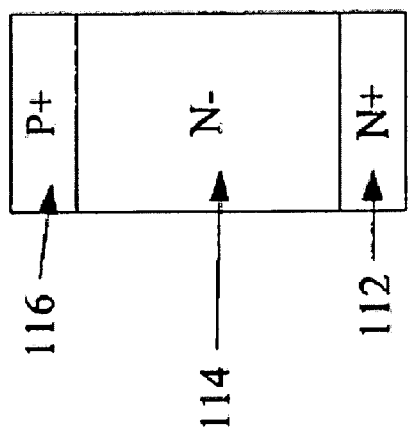
Figure 8C:
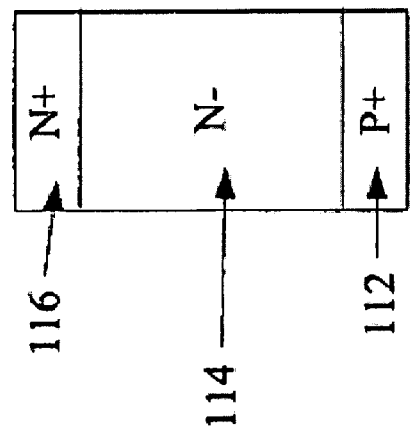

FIGS. 8b to 8d illustrate other permutations of diode structures. In the diodes of FIGS. 8a and 8b, bottom region 112 is N+ (heavily doped n-type silicon), and top region 116 is P+. In the diodes of FIGS. 8c and 8d, bottom region 112 is P+ and top region 116 is N+. In FIGS. 8a and 8c, middle region 114 is N−, while in FIGS. 8b and 8d, middle region 114 is P−. The middle region can intentionally be lightly doped, or it can be intrinsic, or not intentionally doped. An undoped region will never be perfectly electrically neutral, and will always have defects or contaminants that cause it to behave as if slightly n-doped or p-doped. Such a diode can be considered a p-i-n diode. Thus, a P+/N−/N+, P+/P−/N+, N+/N−/P+ or N+/P−/P+ diode can be formed.

Figure 7C:
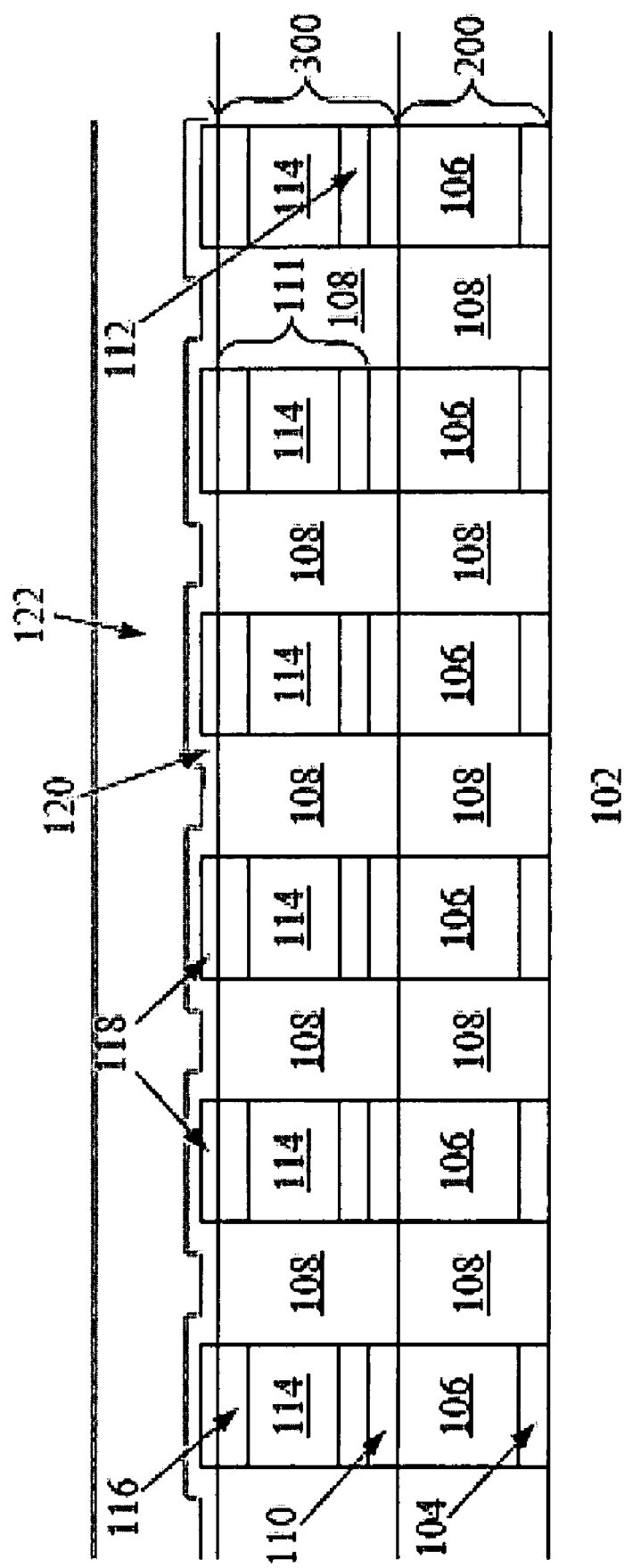

Turning to FIG. 7c, next an optional insulating oxide, nitride, or oxynitride layer 118 may be formed on heavily doped regions 116. Layer 118 will be reduced during formation of a titanium silicide layer 124 (but generally not other metal silicide layers), as will be described below. Alternatively, layer 118 may be omitted. For example, the optional silicon dioxide layer 118 is grown by oxidizing silicon at the tops of heavily doped regions 116 at about 600 to about 850° C. for about 20 seconds to about two minutes, forming between about 1 and about 5 nm of silicon dioxide. Preferably, oxide layer 118 is formed by exposing the wafer to about 800 degrees for about one minute in an oxygen-containing ambient. Layer 118 could be deposited instead.

Next, to form the diode 2 of the first embodiment in a low initial resistivity state, a layer 120 of a silicide-forming metal is deposited. Preferred silicide-forming metals to be used for this purpose include titanium or cobalt. This example will describe the use of titanium for layer 120, but it will be understood that other materials can be used.

Titanium layer 120 is deposited to any suitable thickness, for example between about 1 and about 20 nm, preferably between about 2 and about 15 nm, most preferably about 5 nm. To prevent oxidation of titanium layer 120, titanium nitride layer 122 is deposited, preferably about 30 nm thick. Layers 120 and 122 can be deposited by any conventional method, for example by sputtering.

To form the diode of the second embodiment in a high initial resistivity state, layers 120 and 122 are preferably omitted. Instead, the antifuse dielectric layer 5 shown in FIG. 3 is formed in place of layer 120.

An anneal is performed between about 600 and about 800° C. from about 10 seconds to about two minutes, preferably between about 650 degrees and about 750 degrees, most preferably at about 670 degrees for about 20 seconds, for example in nitrogen. The anneal serves to reduce oxide layer 118 and to react titanium layer 120 with heavily doped regions 116 where it overlies them to form titanium silicide. Oxide layer 118 is substantially entirely reduced between titanium layer 120 and the silicon of heavily doped region 116. If oxide layer 118 was deposited rather than grown, the rest of oxide layer 118 (between the tops of semiconductor pillars 300, overlying dielectric fill 108) would remain.

Figure 7D:
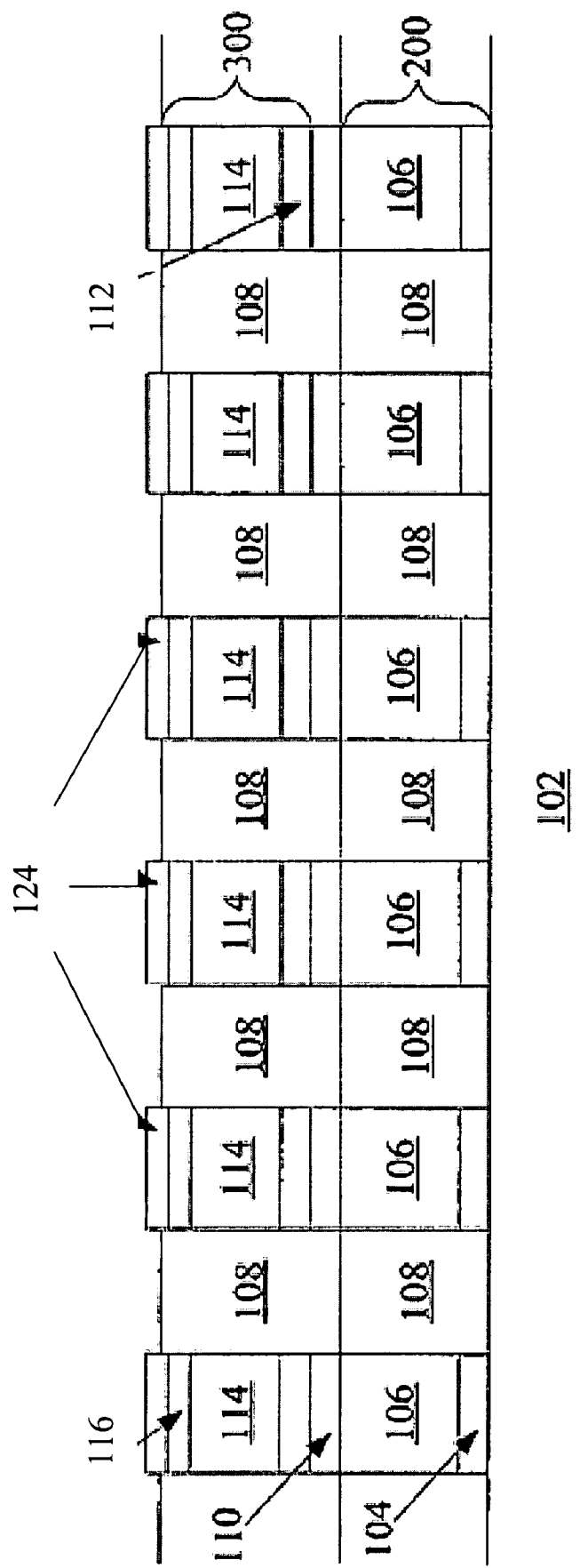

As in a conventional salicide process, titanium nitride layer 122 and unreacted titanium are stripped in a selective wet etch, leaving behind titanium silicide layers 124, each formed in a disk-shaped region on the top of one of the junction diodes, shown in FIG. 7d.

In a preferred embodiment, the titanium silicide feature 124 that is formed during the anneal comprises C49 phase titanium silicide. The C49 phase can be obtained if the annealing temperature is maintained below 700 degrees C. for large or small sized silicon features or if the annealing temperature is maintained above 700 degrees C., but the silicon feature size is 0.25 microns or less. Thus, the diameter of the diode 2 is preferably 0.25 microns or less to form the C49 phase of titanium silicide for annealing temperature above 700 degrees C. This phase is desired due to its lattice match with amorphous silicon during the crystallization process. In contrast larger features (greater than a dimensional size of 0.25 microns) will allow the titanium silicide to end as the C54 phase of titanium silicide during subsequent annealing above 700 degrees C. Even though the C54 phase provides low resistivity (which is highly desired by integrated circuit manufactures), it does not provide as good a lattice match during the crystallization process of the amorphous or polycrystalline silicon. Thus, the C49 phase titanium silicide allows for the greatest enhancement to grain growth and thus a lower diode resistivity by acting as a crystallization template for the semiconductor material of the diode.

As noted, in this example it is assumed that titanium is used in the silicide-forming metal layer 120, but other materials, including cobalt, could have been used instead. Thus, the titanium silicide layer 124 could instead be some other silicide, such as cobalt silicide.

At this point a plurality of first pillars has been formed above the first conductors, each pillar comprising a silicide layer 124.

In preferred embodiments, the junction diode is amorphous silicon as deposited, and is crystallized to form large grain, low resistivity polysilicon in contact with a silicide layer 124. The crystallization can occur during the formation of the silicide 124 and/or during a separate crystallization anneal after the memory cell is completed. The separate crystallization anneal may be conducted at a temperature above about 600° C., such as 650 to 850° C. for 1 or more minutes, such as 2 minutes to 24 hours, depending on the desired degree of crystallization. A lower temperature may be used for germanium and silicon germanium diode materials. The silicide layer 124 is advantageous for reducing the impedance of the junction diode, but may not be desired in the finished device. In an alternative embodiment, following formation of the silicide layer on the junction diode, the silicide layer can be removed.

In the method of forming the diode of the second embodiment in the high resistivity state, the crystallization anneal may be omitted and the diode semiconductor materials may be initially deposited in the high resistivity polycrystalline state.

FIG. 9 illustrates a completed memory cell 3. Top conductors 400 (i.e., the upper electrode 16 shown in FIG. 2) can be formed in the same manner as bottom conductors 200, for example by depositing adhesion layer 420, preferably of titanium nitride, and conductive layer 422, preferably of tungsten. Conductive layer 422 and adhesion layer 420 are then patterned and etched using any suitable masking and etching technique to form substantially parallel, substantially coplanar conductors 400, shown in FIG. 9 extending perpendicular to conductors 200. In a preferred embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level of FIG. 9, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

The present invention has been described herein in the context of a monolithic three dimensional memory array formed above a substrate. Such an array comprises at least a first memory level formed at a first height above the substrate and a second memory level formed at a second height different from the first height. Three, four, eight, or more memory levels can be formed above the substrate in such a multilevel array. Each memory level is monolithically formed on the memory level below it.

The memory cell of the present invention has been described as formed in a monolithic three dimensional memory array having stacked memory levels, but such cells could clearly be formed in a two-dimensional array, as well. The example given showed the silicide layer formed above the junction diode, but those skilled in the art will appreciate that the silicide layer can be formed elsewhere: beside the junction diode or below it, for example. Many configurations can be imagined.

In embodiments described herein, such as in the detailed example, a silicide layer is formed only on the semiconductor pillar. Embodiments can be envisioned, however, in which a silicide layer extends the entire length of one or both electrodes.

An alternative method for forming a similar array in which conductors are formed using Damascene construction is described in Radigan et al., U.S. patent application Ser. No. 11/444,936, "Conductive Hard Mask to Protect Patterned Features During Trench Etch," filed May 31, 2006, assigned to the assignee of the present invention and hereby incorporated by reference. The methods of Radigan et al. may be used instead to form an array according to the present invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of programming a nonvolatile memory array comprising a plurality of nonvolatile memory cells, a plurality of bit lines, and a plurality of word lines, wherein each memory cell comprises a diode, the method comprising:
applying a first reverse bias voltage to at least one selected memory cell such that at least one diode of the at least one selected memory cell is placed in a reverse breakdown state, while at a same time applying a second voltage to adjacent non-selected memory cells which share a bit line or a word line with the at least one selected memory cell such that the diodes of the adjacent non-selected memory cells are not placed in a reverse breakdown state,
wherein the step of applying the second voltage comprises applying the second voltage having half a pulse height of a pulse height of the first reverse bias voltage to the adjacent non-selected memory cells.

2. The method of claim 1, wherein the step of applying the second voltage comprises applying zero volts to non-adjacent non-selected memory cells which do not share a bit line or a word line with the at least one selected memory cell.

3. The method of claim 1, wherein the first reverse bias voltage is greater than about 10 volts.

4. The method of claim 1, wherein the first reverse bias voltage is applied simultaneously to a plurality of selected memory cells such that the diodes of the selected memory cells are placed in a reverse breakdown state.

5. The method of claim 1, wherein each memory cell does not include any active or passive devices except the diode.

6. The method of claim 1, wherein the nonvolatile memory array comprises a monolithic three dimensional array of memory cells.

7. The method of claim 1, wherein each diode comprises a p-i-n semiconductor diode which acts as a read/write element of a respective memory cell.

8. The method of claim 1, wherein each diode comprises a polycrystalline silicon, germanium or silicon-germanium p-i-n pillar diode having a substantially cylindrical shape.

9. The method of claim 1, wherein each diode is fabricated in a low resistivity programmed state in contact with a metal silicide layer.

10. A method of programming a nonvolatile memory array comprising a plurality of nonvolatile memory cells, a plurality of bit lines and a plurality of word lines, wherein each memory cell comprises a diode and a resistivity switching element in a high resistivity state located in series with the diode, the method comprising:
applying a forward bias voltage to at least one selected memory cell such that at least one resistivity switching element of the at least one selected memory cell is placed in a low resistivity state;
applying a first reverse bias voltage to the at least one selected memory cell after the step of applying the forward bias voltage such that at least one diode of the at least one selected memory cell is damaged but not destroyed; and
applying a second reverse bias voltage to at least one memory cell such that the diode of the at least one memory cell is destroyed.

11. The method of claim 10, wherein the resistivity switching element of each memory cell comprises an antifuse.

12. The method of claim 10, wherein the step of applying the second reverse bias voltage comprises applying the second reverse bias voltage having a larger magnitude than the first reverse bias voltage to the at least selected one memory cell containing the damaged diode such that the damaged diode is destroyed.

13. The method of claim 12, wherein:
the first reverse bias voltage is about 8.5 to about 9 volts; and
the second reverse bias voltage is greater than about 10 volts.

14. A method of programming a nonvolatile memory array comprising a plurality of nonvolatile memory cells, a plurality of bit lines and a plurality of word lines, wherein each memory cell comprises a diode and a resistivity switching element in a high resistivity state located in series with the diode, the method comprising:
applying a forward bias voltage to at least one selected memory cell such that at least one resistivity switching element of the at least one selected memory cell is placed in a low resistivity state;
applying a first reverse bias voltage to the at least one selected memory cell after the step of applying the forward bias voltage such that at least one diode of the at least one selected memory cell is damaged but not destroyed; and
during the step of applying the first reverse bias voltage, further applying another voltage having half a pulse height of the pulse height of the first reverse bias voltage to adjacent non-selected memory cells which share a bit line or a word line with the at least one selected memory cell such that the diodes of the non-selected memory cells are not damaged.

15. The method of claim 14, wherein the step of applying another voltage comprises applying zero volts to non-adjacent non-selected memory cells which do not share bit line or a word line with the at least one selected memory cell.

16. The method of claim 14, wherein the first reverse bias voltage is applied simultaneously to a plurality of selected memory cells such that the diodes of the selected memory cells are damaged.

17. The method of claim 14, wherein the nonvolatile memory array comprises a monolithic three dimensional array of memory cells.

18. The method of claim 14, wherein:
 each diode comprises a semiconductor diode which acts as a steering element of a respective memory cell; and
 each diode comprises a polycrystalline silicon, germanium or silicon-germanium p-i-n pillar diode having a substantially cylindrical shape.

* * * * *